United States Patent [19]

Dunn et al.

[11] 4,277,816

[45] Jul. 7, 1981

[54] ELECTRONIC CIRCUIT MODULE COOLING

[75] Inventors: Robert M. Dunn, Endicott; Martin D. Schulman, Wappingers; Nicholas Timko, Jr., Johnson City, all of N.Y.

[73] Assignee: International Business Machines Corporation, Armonk, N.Y.

[21] Appl. No.: 43,404

[22] Filed: May 29, 1979

[51] Int. Cl.³ .............................................. H05K 7/20
[52] U.S. Cl. ................................. 361/384; 165/80 B; 174/16 HS
[58] Field of Search ................... 174/16 HS, 16 R; 361/381, 382, 383, 384; 165/DIG. 11, 122, 80 B, 80 D; 62/413–419

[56] References Cited

U.S. PATENT DOCUMENTS

| 2,169,109 | 8/1939 | Muller | 175/366 |
|---|---|---|---|
| 2,380,026 | 7/1945 | Clarke | 175/366 |
| 3,387,648 | 6/1968 | Ward, Jr. | 361/384 |
| 3,843,910 | 10/1974 | Ringuet | 165/107 |
| 4,093,021 | 6/1978 | Groom | 361/384 |

OTHER PUBLICATIONS

Heat Sink, Bryden, IBM Tech. Discl. Bull., vol. 11, No. 10, Mar. 1969, p. 1323

Primary Examiner—Gerald P. Tolin
Attorney, Agent, or Firm—Gerald R. Gugger

[57] ABSTRACT

An electronic assembly accomplishes module cooling and heat dissipation by directly impinging air flows each uniquely cooling a given module. The spent air is exhausted through channels defined between the modules in a manner such that the spent air has minimal impingement on adjacent modules.

1 Claim, 3 Drawing Figures

ELECTRONIC CIRCUIT MODULE COOLING

BACKGROUND OF THE INVENTION

1. Field of the Invention

This invention relates generally to heat transfer mechanisms and more particularly to an improved heat transfer mechanism for removing the heat generated in and electronic circuit module assembly.

2. Prior Art

The efficient extraction of heat from electronic circuit modules for very large scale integrated circuit packages has presented a very significant limitation on the design capability and use of such electronic modules. Lacking an efficient heat transfer mechanism, the speed and power capabilities of the electronic circuit modules are severely limited. This becomes even more significant when a single electronic circuit module may contain a plurality of integrated circuit chips and related circuitry.

Early semiconductor devices solved the problem by making one of the electrodes of a single circuit device both a thermal and electrical direct contact to the external world with the electrode being connected to an efficient heat transfer device, such as a studded heat sink. This was especially convenient when the electrode could be maintained at, for example, ground potential. Typical discrete semiconductive devices of such a configuration are found in U.S. Pat. Nos. 3,719,862 and 3,836,825. This approach was also used in some of the early approaches to the removal of heat from integrated circuit packages. For example, in an article entitled "Conduction Cooled Heat Plate for Modular Circuit Package" in Volume 13, No. 2 of the July 1970 issue of the IBM Technical Disclosure Bulletin, there is disclosed a cooling technique using a conduction cooled, isothermal heat plate which is metallurgically connected via an appropriate slug to the various circuit chips in an integrated circuit package. With this technique, the chip is fixed at the potential of the heat plate.

With early devices such as high powered metal rectifiers, it was found necessary to also pass cooling air over the external portions of the electronic components. For example, U.S. Pat. No. 2,169,109 is directed to a parallel air flow delivery system for component cooling where the air flow is over and past the components, but is not a direct or redirected impingement jet and does not contain a backboard assembly. U.S. Pat. 2,380,026 is similar to the above-mentioned patent with the addition of a distributor manifold to selectively distribute the air. U.S. Pat. No. 2,843,806 discloses a parallel air flow feed design with each component being cooled by a pass-by air flow, rather than impingement.

U.S. Pat. No. 3,843,910 uses a cooling system which includes an air moving device and air cooled in a heat exchanger under the influence of an external fan which opens into a multiplicity of secondary pipes or circuits, each terminating in a calibrated passage, which allows a predetermined flow rate of fluid to pass. The cool fluid acts directly upon a component or indirectly upon a group of components by way of a fluid distribution box or plenum chamber. However, such a system does not necessarily provide a large degree of turbulence in the area of the object to be cooled and, in addition, is relatively complex in its configuration and the use of a heat exchanger for air cooling.

OBJECTS AND SUMMARY OF THE INVENTION

Accordingly, it is a principal object of the present invention to provide a heat transfer mechanism for an electronic circuit module package assembly which overcomes the foregoing disadvantages of the prior art.

A more specific object of the present invention is to provide a heat transfer mechanism for an electronic circuit module assembly which uses impingement cooling of a directed air flow on a given circuit module to effect heat removal therefrom.

Still another object of the present invention is to provide a heat transfer mechanism for an electronic circuit module assembly using jet impingement air streams to cool a plurality of electronic circuit modules in a manner such that the spent air is channeled out of the assembly in a fashion such that the spent air does not interfere with the cooling of any other modules in the assembly.

An additional object of the present invention is to provide a heat transfer mechanism for an electronic circuit module assembly which uses a relatively low pressure, high volume air flow for removing heat from the modules.

Yet another object of the present invention is to provide a heat transfer mechanism for an electronic circuit module assembly in which the circuit modules can be placed at any relative position on the assembly card or board independent of thermal constraints.

A still further object of the present invention is to provide a heat transfer mechanism for an electronic circuit module assembly which efficiently utilizes the cooling air and has minimal leakage loss.

The foregoing and other objects and advantages are accomplished according to one aspect of the invention wherein a plurality of circuit modules are mounted on a large area circuit board assembly, which circuit board acts as a back mounted assembly for restricting air flow. An air plenum chamber is mounted adjacent the circuit board assembly, with a plurality of openings therein, one for each electronic circuit module of the assembly. A parallel air flow of large volume and relatively low pressure passes into the air plenum and is directed through the openings therein to impinge directly on the electronic circuit modules. After cooling the particular modules, the spent air is directed through channels defined between the modules and is exhausted from the assembly. Because of the positive air pressure directed to impinge on the modules, the channeled exhaust air does not impinge on any further modules in the assembly. In addition, the direct impingement channeling of air provides an increased turbulence in the system, thereby greatly improving the heat transfer characteristics of the assembly. With this assembly a given module can be placed at any relative position on the board since its cooling air supply is unique and is not dependent on previous air flow constraints such as are found with serial cooling.

DESCRIPTION OF THE PREFERRED EMBODIMENT

Figure 1:
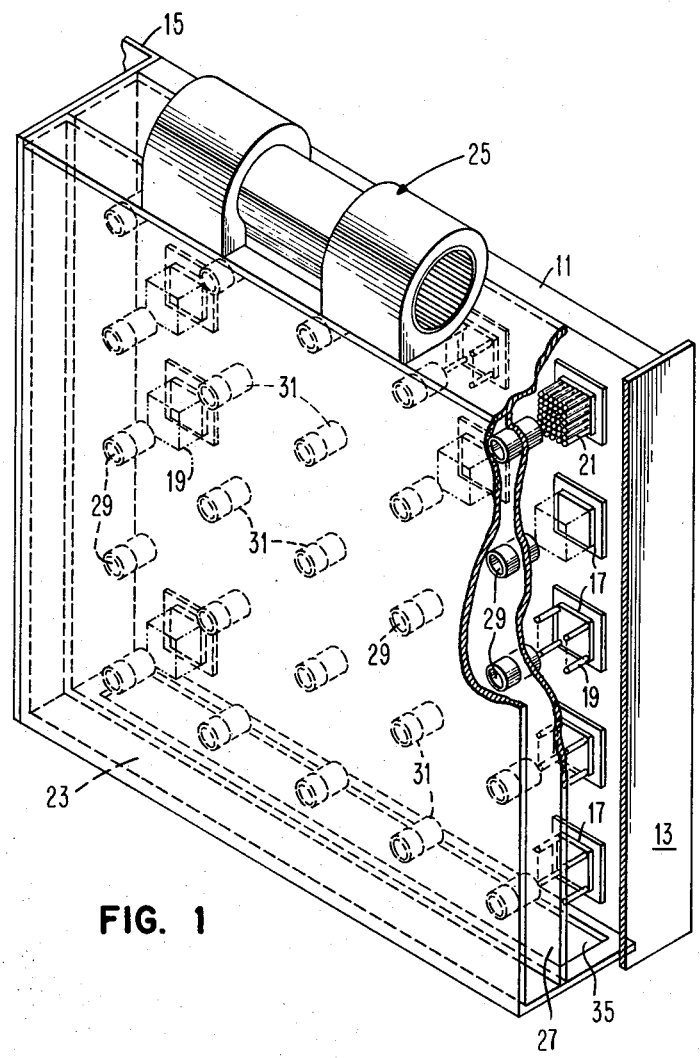
FIG. 1 is a front perspective view, partially in section of an electronic circuit module cooling assembly according to the present invention.

Referring first to FIG. 1, an electronic circuit module cooling assembly according to the present invention includes a printed circuit board backing member 11 supported between members 13 and 15. On the back surface of the circuit board assembly 11 may be contained the back wiring for the circuit assembly (not shown). On the front of the circuit board 11 are mounted a plurality of electronic circuit modules 17 and on the top of each of the modules 17 is a heat sink device 19. A detailed view of the heat sink is shown at 21, containing a plurality of cylindrical rods of a heat conductive material attached to the upper surface of the module 17. Spaced a suitable distance from the top surface of the electronic circuit board assembly is an air plenum 23 having a two scroll air moving device 25 mounted to the top thereof. Internal to the air plenum 23 in the surface 27 facing the electronic circuit board assembly are a plurality of openings 29 and contained in each of the openings is a cylindrical sleeve 31 providing an opening from the air plenum 23 to each of the electronic circuit modules 17 and their heat sinks 19. In the base of the assembly between the air plenum 23 and the electronic circuit board 11, is a slit 35 which permits the exhausted air to be exited from the electronic circuit assembly. In the theory of operation of the cooling of the electronic circuit module assembly, the cooling air is directed by the air moving device 25 into the air plenum 23. The openings 29 with the cylindrical sleeves 31 cause a direct jet air impingement under the pressure of the air in the plenum to be directed on each of the heat sinks 19, 21 of the electronic circuit modules 17. The positive air pressure on each module causes turbulence within the heat sink 21 to greatly promote the cooling of the heat sink and thereafter the air under pressure is exhausted from within the heat sinks 19, 21. This is shown more clearly in FIG. 2, which illustrates the manner in which the exhausted air, after escaping from within the heat sink, is directed into the channels between the modules and because of the positive pressure impinging on the modules through the openings 29, prevents the exhausted air from impinging upon an adjacent module.

Figure 2:
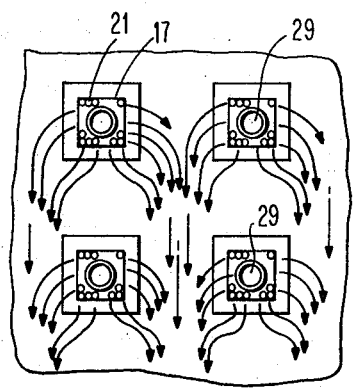
FIG. 2 is a partial top view of electronic circuit modules illustrating the directions of air flow exiting therefrom as the result of a direct impingement cooling jet thereon.

Referring still to FIG. 2, while the air currents shown there are simplified to illustrate the channeling of the exhausted air in the spacings between the modules, it is to be understood that the turbulence within the heat sinks of the respective modules is more diverse than actually illustrated and thereby promotes significant air cooling. This coupled with the fact that the spent air from a given module cannot significantly impinge on an adjacent module or modules provides a greatly enhanced cooling system which operates at a much lower relative air pressure. Because it operates at a lower air pressure, there will be a significant reduction in the amount of acoustic noise within the system. The system will also have a better external thermal resistance value and eliminates an increasing temperature gradient which might otherwise be found across the surface of the electronic circuit module assembly. As the spent air appoaches the bottom of the chamber between the air plenum 23 and the circuit board 11, it is exhausted through the slit 35 therein to the outside environment.

As mentioned previously, this configuration provides two distinct advantages over the prior art serial cooling systems. First, there is effective positional independence for any given module on the circuit board. By this is meant that the designer can place a given module any place wants on the surface of the printed circuit board since the air that will be used to cool this module is unique to the module and is determined by the opening in the plenum adjacent thereto. Such was not the case with the prior art serial cooling systems, since the air cooling a particular module may have impinged on one or more modules prior to reaching that particular module. Therefore, for example, for a very high power module, it may have been necessary to locate that near the input port of the cooling air for the serial cooling system to permit the necessary cooling. Therefore, there was a direct relationship between the amount of cooling required and the position of a module on a board surface.

The second significant consideration is that the present system has a very high efficiency in terms of the use of the cooling air generated. Prior art systems typically had a significant leakage as the air was passed around and through the modules in a serial fashion. However with the design configuration of the present invention, the air plenum can be designed to be relatively air tight and after the air is directed therefrom onto the module to be cooled, there is no requirement to maintain air tightness within the system since the air will have already accomplished its cooling purpose. Accordingly, almost all of the air generated is effective in cooling a given module or modules.

Figure 3:
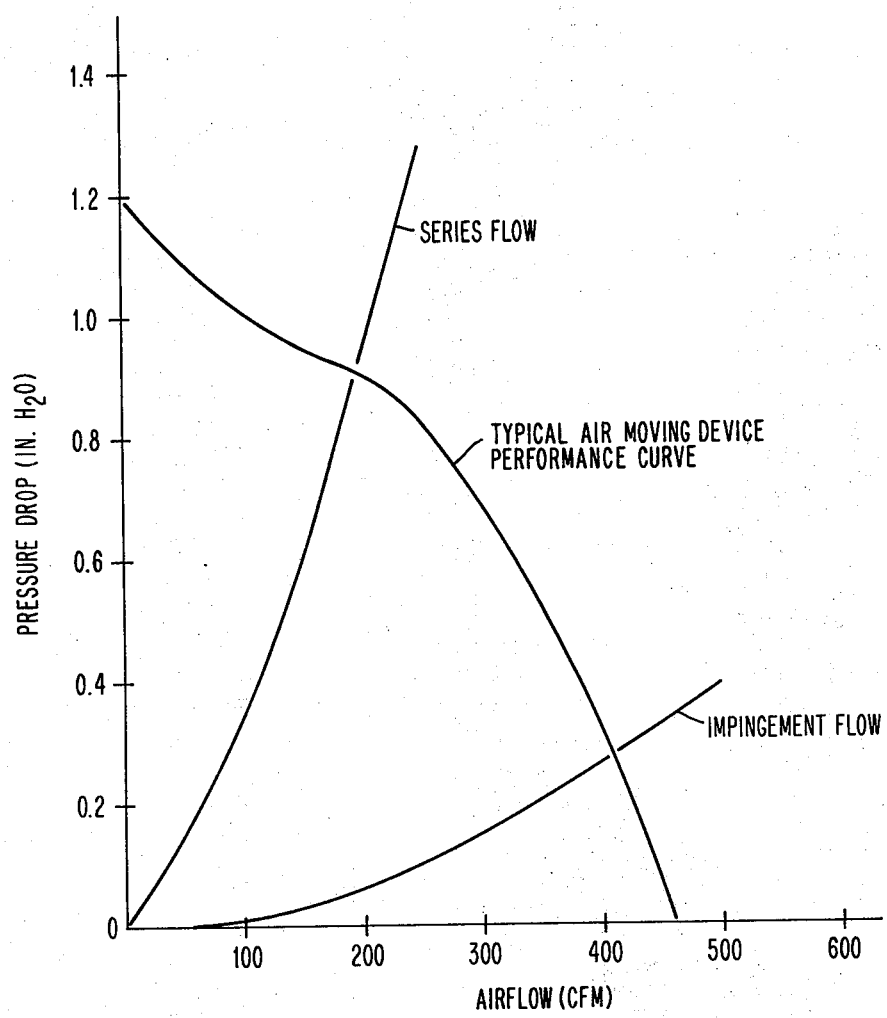
FIG. 3 is a chart showing the relationship between the pressure drop and the air flow as compared to a series flow system and an impingement flow system.

Referring next to FIG. 3, there is shown a relative air flow impedance curve for a series flow air cooling system such as found in the prior art and the impingement flow system according to the present invention. The curve depicts the air flow in cubic feet per minute along the X axis and the pressure drop in inches of water along the Y axis. The solid curve running between the X and Y axes is a typical air moving device performance curve. For example, it is known that as the resistance to the air movement increases (increase in pressure drop) the amount of air flow diminishes. Therefore, a given air moving device will have its own unique performance curve. This curve shows, as a typical example that with an impingement air flow system, an air flow of about 400 cubic feet of air per minute generates about a quarter of an inch water back pressure. For a similar series flow system, an air flow of 200 cubic feet per minute generates a back pressure of about 0.9 inches of water. In a given configuration this could mean, for example, that with an impingement flow system, one could have approximately 18 cubic feet per minute per module to generate a desired cooling, whereas with a series air flow system (assuming a 20% by pass leakage) that there would be 32 cubic feet per minute per module required to provide the desired cooling. Therefore, not only is there a greater series air flow per module, but a series system also operates at a much higher back pressure, thereby increasing the acoustic noise inherent in such a system.

In a given system, it may be desirable to have different air flows impinging on the different modules, depending upon the amount of heat generated within the module based upon its power usage. This could be done by changing the size of the openings 29 in the wall of the chamber facing the modules or could be done by placing suitable screens over the openings 29 to reduce the net air flow therethrough.

It is noted that any of a wide variety of heat sinks could be used with the system of the present invention. Radial fins, dendrites and even solid covers could be used and take advantage of the improved performance provided herein.

Other and varied modifications and changes will become apparent to those skilled in the art within the spirit and scope of the present invention. It is therefore intended that the invention not be limited to the specifics of the foregoing description of the preferred embodiment, but is rather to embrace the full scope of the appended claims.

Having thus described our invention, what we claim as new, and desire to secure by Letters Patent is:

1. A cooling apparatus combined with an electronic circuit assembly which includes a plurality of electronic cirucit modules mounted on a back mounting board assembly with the spaces between modules defining channels and the exposed surface of each module having a plurality of heat sink rods extending from said surface, said combination comprising:

an air plenum receiving cooling air at a relatively constant pressure, said plenum including a plurality of openings in one wall thereof, said number of openings being equal to the number of circuit modules on said board assembly and the pattern of said openings conforming approximately to the pattern of said circuit modules on said board assembly;

means mounting said plenum adjacent said board assembly with said openings facing toward the head sink rods and exposed surface of their associated modules; and a plurality of hollow cylinders each having one end attached to an associated one of said openings and its opposite end disposed proximate to its associated module whereby a controled flow of air is caused to impinge in parallel down through said heat sink rods and onto the exposed surface of each of said modules, said air flow causing a turbulence within said heat sink rods to enhance the cooling of said modules with the spent air exhausting through the channels between the modules with minimum impingement on adjacent modules.

* * * * *